(12) United States Patent
Osawa et al.

(10) Patent No.: US 12,248,005 B2
(45) Date of Patent: Mar. 11, 2025

(54) SHUNT RESISTOR AND MANUFACTURING METHOD THEREOF

(71) Applicant: KOA CORPORATION, Ina (JP)

(72) Inventors: Ryou Osawa, Ina (JP); Takeshi Kuroda, Ina (JP)

(73) Assignee: KOA CORPORATION, Nagano (JP)

( * ) Notice: Subject to any disclaimer, the term of this patent is extended or adjusted under 35 U.S.C. 154(b) by 320 days.

(21) Appl. No.: 17/925,211

(22) PCT Filed: May 6, 2021

(86) PCT No.: PCT/JP2021/017370
§ 371 (c)(1),
(2) Date: Nov. 14, 2022

(87) PCT Pub. No.: WO2021/235229
PCT Pub. Date: Nov. 25, 2021

(65) Prior Publication Data
US 2023/0194572 A1    Jun. 22, 2023

(30) Foreign Application Priority Data
May 19, 2020 (JP) ................................. 2020-087233

(51) Int. Cl.
*G01R 1/20* (2006.01)
*H01C 1/144* (2006.01)
*H01C 17/28* (2006.01)

(52) U.S. Cl.
CPC ............ *G01R 1/203* (2013.01); *H01C 1/144* (2013.01); *H01C 17/28* (2013.01)

(58) Field of Classification Search
CPC ......... H01C 1/144; H01C 17/28; G01R 1/203
See application file for complete search history.

(56) References Cited

U.S. PATENT DOCUMENTS 10,969,408 B2 *  4/2021  Miyajima ............ G01R 15/207
11,961,642 B2 *  4/2024  Ko ........................ H01C 1/144
(Continued)

FOREIGN PATENT DOCUMENTS

JP    2014-85245 A    5/2014
JP    2015-184206 A   10/2015
(Continued)

OTHER PUBLICATIONS

International Search Report dated Jul. 13, 2021, issued in counterpart International Application No. PCT/JP2021/017370, with English Translation. (4 pages).

*Primary Examiner* — Kyung S Lee
(74) *Attorney, Agent, or Firm* — WHDA, LLP

(57) ABSTRACT

A shunt resistor (1) includes: a resistance element (3); a first electrode (5A) and a second electrode (5B) coupled to both sides of the resistance element (3); a first fusion material (6A) and a second fusion material (6B) electrically coupled to the first electrode (5A) and the second electrode (5B), respectively, the first fusion material (5A) and the second fusion material (5B) having electric conductivity; and at least one board (10) coupled to the first electrode (5A) and the second electrode 15B) by the first fusion material (6A) and the second fusion material (6B). The first fusion material (6A) is arranged in a first through-hole (7A) formed in the first electrode (5A) or the board (10), and the second fusion material (6B) is arranged it as second through-hole (7B) formed in the second electrode (5B) or the board (10).

10 Claims, 9 Drawing Sheets

(56) References Cited

U.S. PATENT DOCUMENTS

| | | | |
|---|---|---|---|
| 2012/0154104 A1* | 6/2012 | Hetzler | H01C 1/14 |
| | | | 29/874 |
| 2015/0309080 A1* | 10/2015 | Chae | G01R 15/202 |
| | | | 324/251 |
| 2017/0003322 A1* | 1/2017 | Nakamura | G01R 15/146 |
| 2019/0162757 A1 | 5/2019 | Miyajima et al. | |

FOREIGN PATENT DOCUMENTS

| | | |
|---|---|---|
| JP | 2017-9419 A | 1/2017 |
| JP | 2019-66499 A | 4/2019 |
| JP | 2019-201131 A | 11/2019 |
| WO | 2018/003360 A1 | 1/2018 |
| WO | 2020/021987 A1 | 1/2020 |
| WO | 2020/095733 A1 | 5/2020 |

* cited by examiner

SHUNT RESISTOR AND MANUFACTURING METHOD THEREOF

TECHNICAL FIELD

The present invention relates to a shunt resistor for current detection and more particularly to a voltage-detection terminal of the shunt resistor. The present invention further relates to a method of manufacturing such a shunt resistor.

BACKGROUND ART

Conventionally, a shunt resistor is widely used in current detecting applications, such as monitoring a charging/discharging current of an in-vehicle battery. Such a shunt resistor includes a resistance element made of a low resistance material, electrodes coupled to both ends of the resistance element, and voltage-detection terminals electrically coupled to the electrodes. The voltage-detection terminals are used to measure a voltage (potential difference) applied to the resistance element.

As a trend of high-current application (which is one of market demands) progresses, a thickness and a width of the electrodes sandwiching the resistance element tend to increase. With the increase of the electrodes, a configuration of a voltage detector coupled to the electrodes itself may affect the current detection accuracy. Therefore, as shown in Patent Documents 1 to 3, various configurations voltage detectors have been proposed.

CITATION LIST

Patent Literature

Patent document 1: Japanese laid-open patent publication No. 2017-009419
Patent document 2: Japanese laid-open patent publication No. 2014-085245
Patent document 3: Japanese laid-open patent publication No. 2015-184206

SUMMARY OF INVENTION

Technical Problem

Patent Document 1 discloses a technique in which a pin as a voltage-detection terminal is provided in a vertical position on an electrode. Specifically, a through-hole is first formed in the electrode, the pin is then inserted into the through-hole and the pin is fixed to the electrode. However, a machining accuracy of the through-hole that receives the pin may greatly affect the current detection accuracy.

Patent Document 2 discloses a technique of fixing a circuit board holding u voltage detection IC to a bus bar with a screw. However, this technique of Patent Document 2 needs to form a screw hole for inserting the screw. Furthermore, fixing with the screw requires a large area to some extent and may affect the current detection accuracy.

Patent Document 3 discloses a technique of connecting a pair of bonding wires for detecting a voltage to a resistor. However, a joint strength of the bonding wires is low, and as a result, the current detection accuracy may decrease with time.

Therefore, the present invention provides a shunt resistor having a voltage-detection terminal capable of ensuring high current detection accuracy, and a method of or manufacturing the same.

Solution to Problem

In an embodiment, there is provided a shunt resistor comprising: a resistance element; a first electrode and a second electrode coupled to both sides of the resistance element; a first fusion material and a second fusion material electrically coupled to the first electrode and the second electrode, respectively, the first fusion material and the second fusion material having electric conductivity; and at least one board coupled to the first electrode and the second electrode by the first fusion material and the second fusion material, wherein the first fusion material is arranged in a first through-hole formed in the first electrode or the board, and the second fusion material is arranged in a second through-hole formed in the second electrode or the board.

In an embodiment, the first through-hole and the second through-hole are formed in the board.

In an embodiment, the board further includes conductive layers constituting an inner wall of the first through-hole and an inner wall of the second through-hole.

In an embodiment, the first fusion material and the second fusion material comprise solder.

In an embodiment, the board is a wiring board having a first wire and a second wire electrically coupled to the first fusion material and the second fusion material, respectively.

In an embodiment, the shunt resistor further comprises an insulating plate arranged between the board and the first and second electrodes.

In an embodiment, there is provided a method of manufacturing a shunt resistor, comprising: preparing at least one board having a first through-hole and a second through-hole; disposing a first fusion material and a second fusion material in the first through-hole and the second through-hole, respectively, the first fusion material and the second fusion material having electric conductivity; heating the first fusion material and the second fusion material, with the first through-hole and the second through-hole facing a first electrode and a second electrode, respectively, until the first fusion material and the second fusion material are fused, the first electrode and the second electrode being coupled to both sides of a resistance element; and coupling the board to the first electrode and the second electrode by the first fusion material and the second fusion material.

In an embodiment, the first fusion material and the second fusion material comprise solder.

In an embodiment, there is provided a method of manufacturing a shunt resistor, comprising: preparing a first electrode and a second electrode coupled to both sides of a resistance element; disposing a first fusion material and a second fusion material in a first through-hole and a second through-hole, respectively, the first through-hole and the second through-hole being formed in the first electrode and the second electrode, respectively, the first fusion a material and the second fusion material having electric conductivity; heating the first fusion material and the second fusion material, with a board facing the first through-hole and the second through-hole, until the first fusion material and the second fusion material are fused; and coupling the board to the first electrode and the second electrode by the first fusion material and the second fusion material.

In an embodiment, the first fusion material and the second fusion material comprise solder.

Advantageous Effects of Invention

According to the present invention, the first fusion and the second fusion material themselves function as voltage-detection terminals. Unlike conventional voltage-detection terminals, the present invention does not require elements, such as pins, bonding wires, and screws, and the current detection accuracy does not deteriorate due to improper installation of these elements. Therefore, the shunt resistor of the present invention can achieve high current detection accuracy.

DESCRIPTION OF EMBODIMENTS

Hereinafter, embodiments of the present invention will be described with reference to the drawings.

Figure 1:
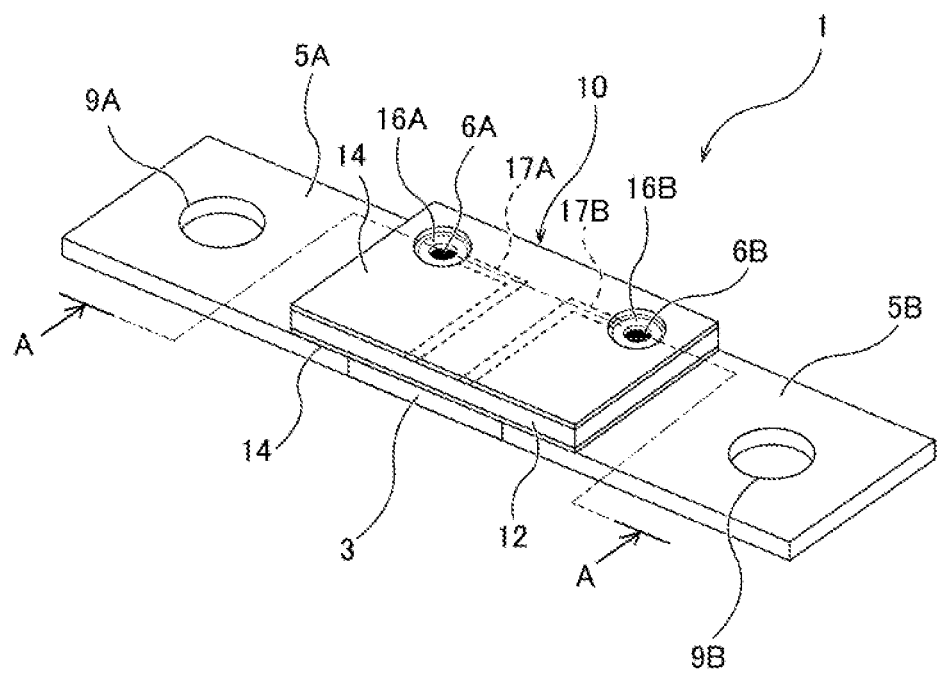
FIG. 1 is a perspective view of an embodiment of a shunt resistor.
Figure 2:
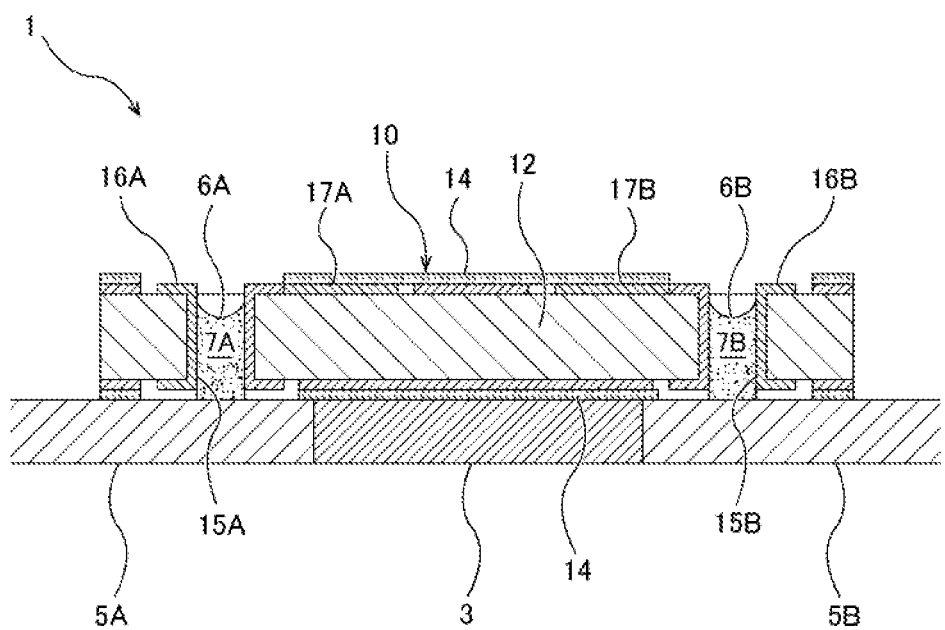
FIG. 2 is a cross-sectional view taken along line A-A of FIG. 1.

FIG. 1 is a perspective view showing an embodiment of a shunt resistor, and FIG. 2 is a cross-sectional view taken along line A-A of FIG. 1. The shunt resistor 1 includes a resistance element 3, a first electrode 5A and a second electrode 5B coupled to both sides of the resistance element 3, a first fusion material 6A and a second fusion material 6B electrically coupled to the first electrode 5A and the second electrode 5B, respectively, and a board 10 coupled to the first electrode 5A and the second electrode 5B by the first fusion material 6A and the second fusion material 6B.

Examples of material of the resistance element 3 include a nickel-chromium alloy, a copper-nickel alloy, a copper-manganese alloy, and a copper-manganese-nickel alloy, while the material of the resistance element 3 is not particularly limited as long as the material can achieve its intended purpose. Copper (Cu) is an example of material of the first electrode 5A and the second electrode 5B, while the material of the first electrode 5A and the second electrode 5B is not particularly limited as long as the material can achieve its intended purpose. The first electrode 5A and the second electrode 5B have bolt holes 9A and 9B for fixing an entire position of the shunt resistor 1.

The first fusion material 6A and the second fusion material 6B are made of electrically conductive material. In this embodiment, the first fusion material 6A and the second fusion material 6B are made of solder. As shown in FIG. 2, the first fusion material 6A is arranged in a first through-hole 7A formed in the board 10. The first fusion material 6A made of solder is in a cured state after being heated and fused. An end of the first fusion material 6A is in contact with the first electrode 5A. The second fusion material 6B is arranged in a second through-hole 7B formed in the board 10. The second fusion material 6B made of solder is also in a cured state after being heated and fused, as well as the first fusion material 6A. An end of the second fusion material 6B is in contact with the second electrode 5B.

The board 10 used in this embodiment is a wiring hoard (or printed circuit board) on which wires are printed. The board 10 has a base plate 12 and insulating layers 14 that cover upper and lower surfaces of the base plate 12. Examples of material of the base plate 12 include resin (e.g., glass epoxy), ceramic, metal (e.g., aluminum), and combinations thereof. Upper and lower surfaces of the board 10 are, formed of the insulating layers 14. The insulating layer 14 forming the lower surface of the board 10 is in contact with the first electrode 5A, the second electrode 5B, and the resistance element 3. Although not shown in the drawings, the board 10 may further include an amplifier, an A/D converter, a temperature sensor, and other element. The board 10 shown in FIGS. 1 and 2 is one example, and the configurations of the board 10 are not limited to the embodiment shown in FIGS. 1 and 2 as long as the board 10 has the base plate 12, the first through-hole 7A, and the second through-hole 7B.

The first through-hole 7A faces the first electrode 5A, and the second through-hole 7B faces the second electrode 5B. The board 19 further includes a first conductive layer 15A forming an inner all of the first through-hole 7A, a second conductive layer 15B forming an inner wall of the second through-hole 7B and a first land 16A and a second land 16B coupled to the first conductive layer and the second conductive layer 15B, respectively. The first conductive layer 15A forming the inner wall of the first through-hole 7A and the first land 16A form a single structure. The second conductive layer 15B forming the inner wall of the second through-hole 7B and the second land 16B form a single structure. Examples of the first land 16A, the second land 16B, the first conductive layer 15A, and the second conductive layer 15B include electrically conductive materials, such as copper foil, gold foil, and silver foil. The copper foil or the gold foil can be formed on the base plate 12 by plating. The first land 16A and the second land 16B are electrically coupled to a first wire 17A and a second wire 17B, respectively, arranged on the base plate 12. In the present embodiment, the first wire 17A and the second wire 17B are printed wires. The first wire 17A and the second wire 17B may be on an inside (inner layer pattern), a front surface, or a back surface of the base plate 12, and their arrangements are not limited.

Horizontal cross-sectional shapes of the first through-hole 7A and the second through-hole 7B are not particularly limited. Examples of the horizontal cross-sectional shapes include a circle and a semicircle. In the case of a circular shape, a diameter of the first through-hole 7A and the second through-hole 7B is 10 mm or less.

The first fusion a material 6A is in contact with the first conductive layer 15A, forming the inner wall of the first through-hole 7A, and the first electrode 5A. Therefore, the first fusion material 6A establishes an electrical connection between the first conductive layer 15A and the first electrode 5A. Similarly, the second fusion material 6B is in contact with the second conductive layer 15B, forming the inner wall of the second through-hole 7B, and the second electrode 5B. Therefore, the second fusion material 6B establishes an electrical connection between the second conductive layer 15B and the second electrode 5B. In order to mechanically couple the board 10 to the first electrode 5A and the second electrode 5B, a mechanical coupling element, such a bolt, or resin material, may be further provided.

Figure 3:
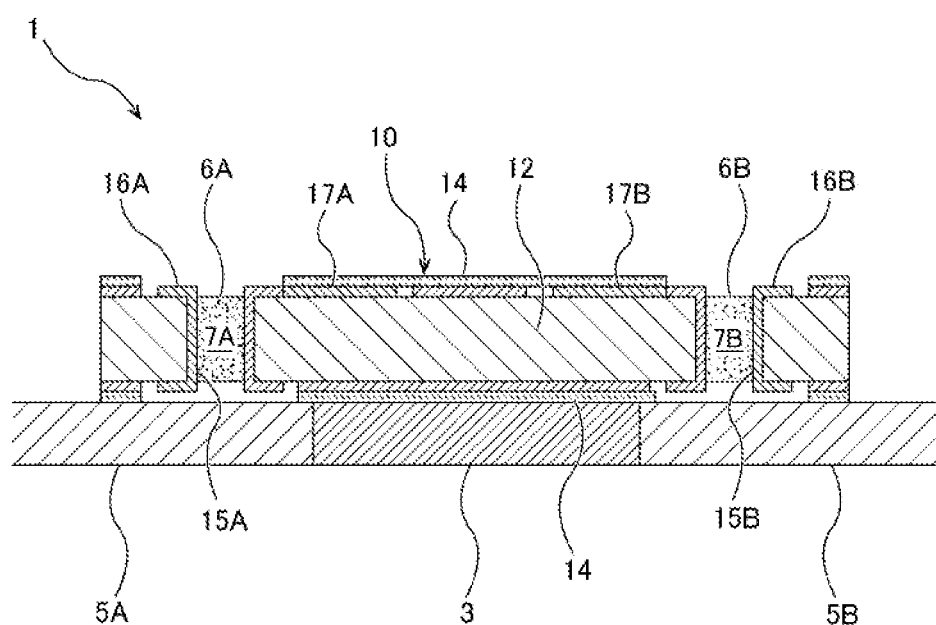
FIG. 3 is a cross-sectional view showing the shunt resistor before a first fusion material and a second fusion material are fused.

The first fusion material 6A and the second fusion material 6B made of solder shown FIG. 2 are in a cured state after being heated and fused. FIG. 3 is a cross-sectional view showing the shunt resistor 1 before the first fusion material 6A and the second fusion material 6B are fused. As shown in FIG. 3, the first fusion material 6A and the second fusion material 6B made of solder are arranged (or filled) in the first through-hole 7A and the second through-hole 7B respectively.

By heating the first fusion material 6A and the second fusion material 6B the first fusion material 6A and the second fusion material 6B are fused. As a result, as shown in FIG. 2, the first fusion material 6A and the second fusion material 6B are fused in the first through-hole 7A and the second through-hole 7B, and contact the first electrode 5A and the second electrode 5B, respectively. As the temperatures of the first fusion material 6A and the second fusion material 6B are lowered, the first fusion material 6A and the second fusion material 6B are cured. The cured first fusion material 6A is joined to both the first electrode 5A and the first conductive layer 15A forming the inner wall of the first through-hole 7. The cured second fusion material 6B is joined to both the second electrode 5B and the second conductive layer 15B forming the inner wall of the second through-hole 7B. In this way, the board 10 is electrically coupled to the first electrode 5A and the second electrode 5B through the first fusion material 6A and the second fusion material 6B.

According to this embodiment, the first fusion material 6A and the second fusion material 6B themselves shown in FIG. 2 electrically function as voltage-detection terminals. Unlike conventional voltage-detection terminals, this embodiment does not require elements, such as pins, bonding wires, or screws. Therefore, the current detection accuracy does not decrease due to improper installation of these elements. The shunt resistor 1 of the present embodiment can achieve high current detection accuracy. Furthermore, according to the present embodiment, it is not necessary to form through-holes or screw holes in the first electrode and the second electrode 5B. Therefore, the present embodiment can prevent a decrease in the current detection accuracy due to the hole machining accuracy required by an electric function.

Examples of the solder as the first fusion material 6A and the second fusion material 6B arranged in the first through-hole 7A and the second through-hole 7B before being heated include solder paste and thread stapler. The first fusion material 6A and the second fusion material 6B may be material other than solder as long as it has an electric conductivity and has an adhesive and fixing function. For example, a copper paste or a conductive adhesive may be used.

In the above-described embodiment, the single board 10 having both the first through-hole 7A and the second through-hole 7B is used, but the present invention is not limited to the above-described embodiment. In one embodiment, the board 10 may include a first board having a first through-hole 7A and a second board having a second through-hole 7B. Also in this confirmation, the first board is coupled to the first electrode 5A by the first fusion material 6A arranged in the first through-hole 7A, and the second board is coupled to the second electrode 5B by the second fusion material 6B arranged in the second through-hole 7B.

Next, a method of manufacturing the shunt resistor 1 shown in FIGS. and 2 will be described with reference to FIGS. 4 to 6.

Figure 4:
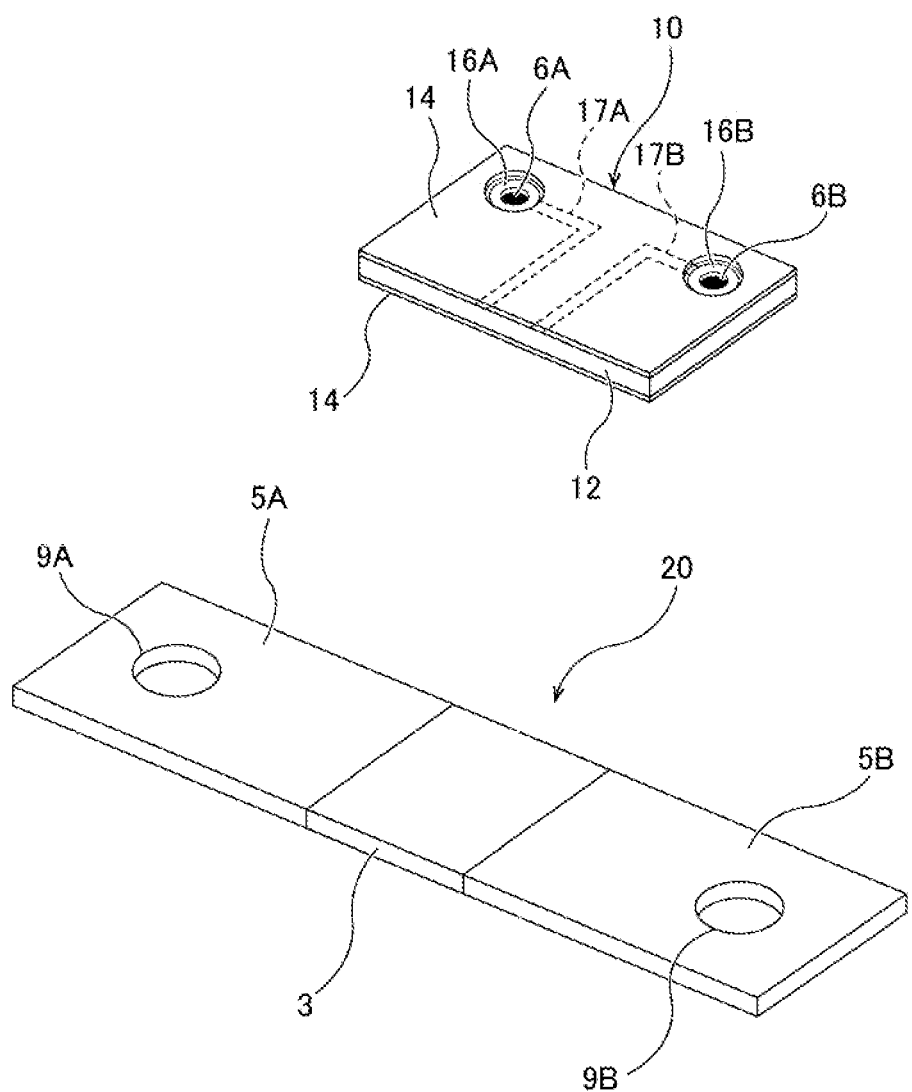
FIG. 4 is a diagram illustrating an embodiment of a method of manufacturing the shunt resistor shown in FIGS. 1 and 2.

First, as shown in FIG. 4, the board 10 having the first through-hole 7A and the second through-hole 7B is prepared. Further, an assembly 20 including the resistance element 3 and the first electrode 5A and the second electrode 5B coupled to both sides of the resistance element 3 is prepared.

Figure 5:
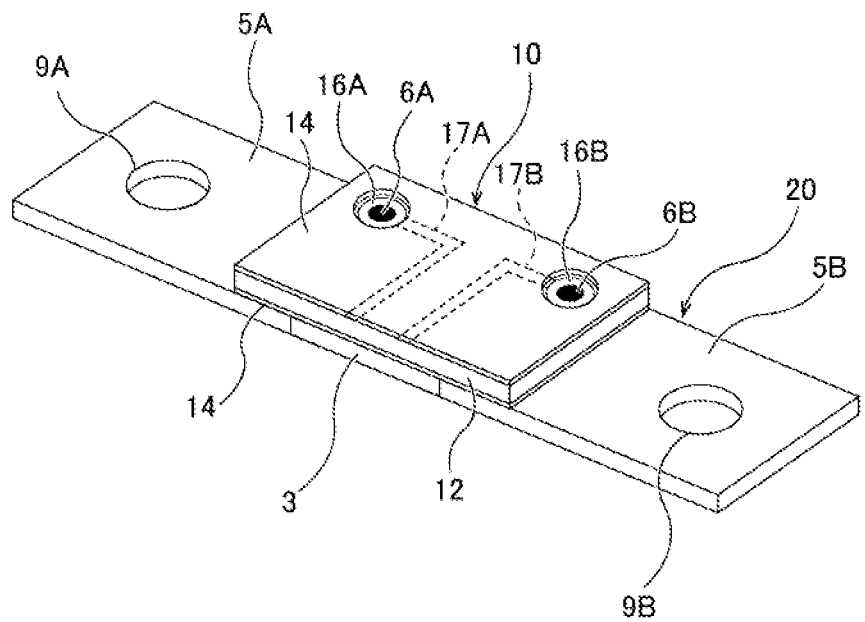
FIG. 5 is a diagram illustrating an embodiment of the method of manufacturing the shunt resistor shown in FIGS. 1 and 2.

As shown in FIG. 5, the board 10 is disposed on the assembly 20 such that the first through-hole 7A and the second through-hole 7B face the first electrode 5A and the second electrode 5B, respectively, coupled to both sides of the resistance element 3.

As described with reference to FIG. 3, the unfused first fusion material 6A and the unfused second fusion material 6B are disposed (or filled) in the first through-hole 7A and the second through-hole 7B, respectively.

In one embodiment, after the board 10 is disposed on the assembly 20, the unfused first fusion material 6A and the unfused second fusion material 6B may be disposed (or filled) in the first through-hole 7A and the second through-hole 7B, respectively.

Figure 6:
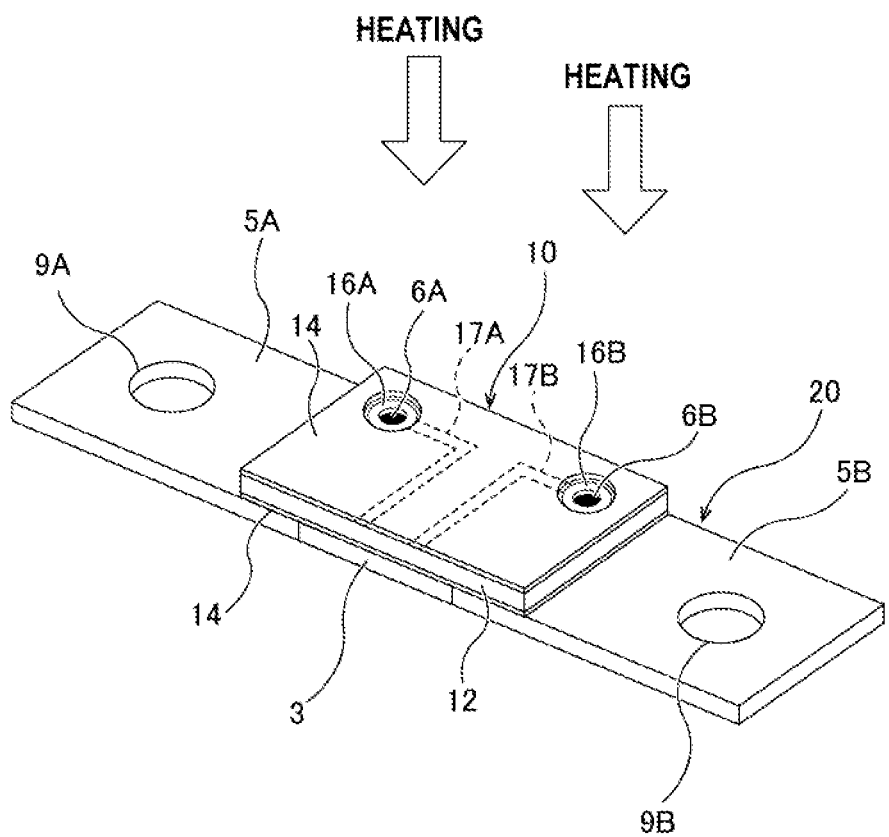
FIG. 6 is a diagram illustrating an embodiment of the method of manufacturing the shunt resistor shown in FIGS. 1 and 2.

As shown in FIG. 6 with the board 10 in contact with the assembly 20, the first fusion material 6A and the second fusion material 6B are heated, so that the first fusion material 6A and the second fusion material 6B are fused. The heating temperature is equal to or higher than a melting point of the first fusion material 6A and the second fusion material 6B. The heating of the first fusion material 6A and the second fusion material 6B may be heating the entireties of the assembly 20 and the board 10 including the first fusion material 6A and the second fusion material or may be locally heating the first fusion material 6A and the second fusion material 6B. For example, heating of the first fusion material 6A and the second fusion material 6B can be performed by using a reflow device, a laser heater, or the like.

When the fused first fusion material 6A and the fused second fusion material 6B are cooled, the first fusion material 6A and the second fusion material 6B are cured as described with reference to FIG. 2. The cured first fusion material 6A is joined to both the first electrode 5A, and the first conductive layer 15A forming the inner wall of the first through-hole 7A, and the cured second fusion material 6B is joined to both the second electrode 5B and the second conductive layer 15B forming the inner wall of the second through-hole 7B. The board 10 is coupled to the first electrode 5A and the second electrode 5B by the first fusion material 6A and the second fusion material 6B. Since the cured first fusion material 6A and the cared second fusion material 6B are in contact with the first electrode 5A and the second electrode 5B, respectively, the first fusion material 6A and the second fusion material 6B function as voltage-detection terminals of the shunt resistor 1.

Figure 7:
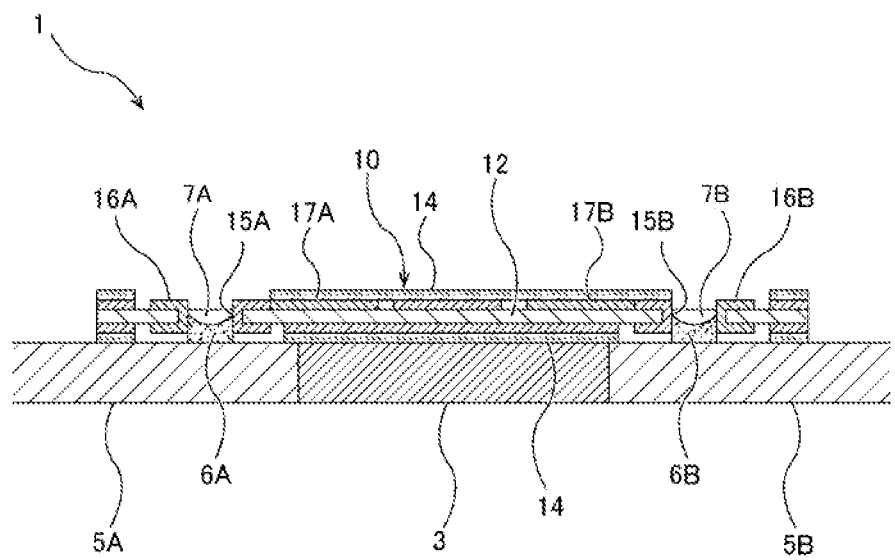
FIG. 7 is a cross-sectional view showing another embodiment of a shunt resistor.

FIG. 7 is a cross-sectional view showing another embodiment of a shunt resistor 1. Configurations and manufacturing method of the present embodiment, which will not be particularly described, are the same as those of the embodiments described with reference to FIGS. 1 to 6, and repetitive descriptions thereof will be omitted.

In this embodiment, a flexible board is used for the board 10. The board 10 made of the flexible board includes base plate 12 made of a flexible sheet. The base plate 12 of the present embodiment is thinner than a general base plate made of glass epoxy. A thickness and a material of the board 10 used for the shunt resistor 1 are not particularly limited.

Figure 8:
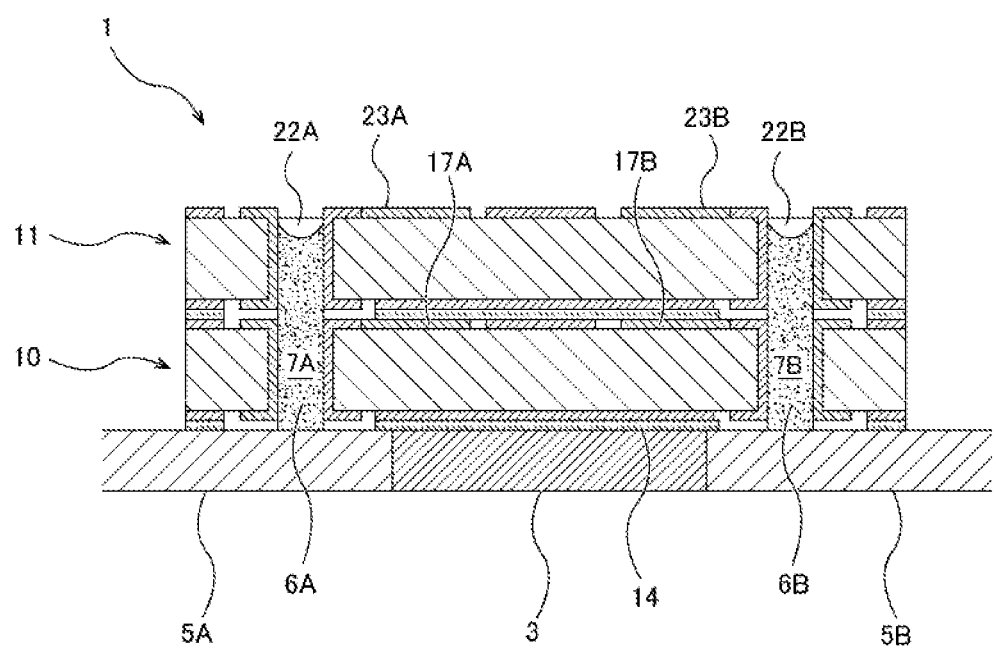
FIG. 8 is a cross-sectional view showing still another embodiment of a shunt resistor.

FIG. 8 is a cross-sectional view showing still another embodiment of a shunt resistor 1. Configurations and manufacturing method of the present embodiment, which will not be particularly described, are the same as those of the embodiments described with reference to FIGS. 1 to 6, and repetitive descriptions thereof will be omitted.

In the present embodiment, a board 11 is disposed over a board 10, and these two boards 10 and 11 are coupled to the first electrode 5A and the second electrode 5B by the first fusion material 6A and the second fusion material 6B. The two boards 10 and 11 have first through-hole 7A and third through-hole 22A, respectively. The first through-hole 7A and the third through-hole 22A are arranged in series. The first fusion material 6A is arranged in the first through-hole 7A and the third through-hole 22A. Similarly, the two boards 10 and 11 have second through-hole 7B and fourth through-hole 22B, respectively. The second through-hole 7B and the fourth through-hole 22B are arranged in series. The second fusion material 6B is arranged in the second through-hole 7B and the fourth through-hole 22B. The two boards 10 and 11 are coupled to each other by the first fusion material 6A and the second fusion material 6B, and the two boards 10 and 11 are further coupled to the first electrode 5A and the second electrode 5B by the first fusion material 6A and the second fusion material 6B. Since each of the two boards 10 and 11 has the same configurations as the board 10 shown in FIG. 2, detailed descriptions thereof are omitted.

Each of the boards 10 and 11 is a printed circuit board having wires electrically coupled to the firs fusion material 6A and the second fusion material 6B as voltage-detection terminals. Wires 17A and 17B of the board 10, which is one of the twin boards, can be used for measuring a voltage (potential difference) for the purpose of current detection, as described above. Wires 23A and 23B of the other board 11 can be used for measuring a current or voltage as a control signal. In this way, the shunt resistor 1 including the plurality of boards 10 and 11 having the wires 17A, 17B, 23A and 23B electrically coupled to the first fusion material 6A and the second fusion material 6B can be used for various applications including current detection as an original application. In the embodiment shown in FIG. 8, the two boards 10 and 11 are superimposed on top of another, while three or more boards may be superimposed on top of another.

Figure 9:
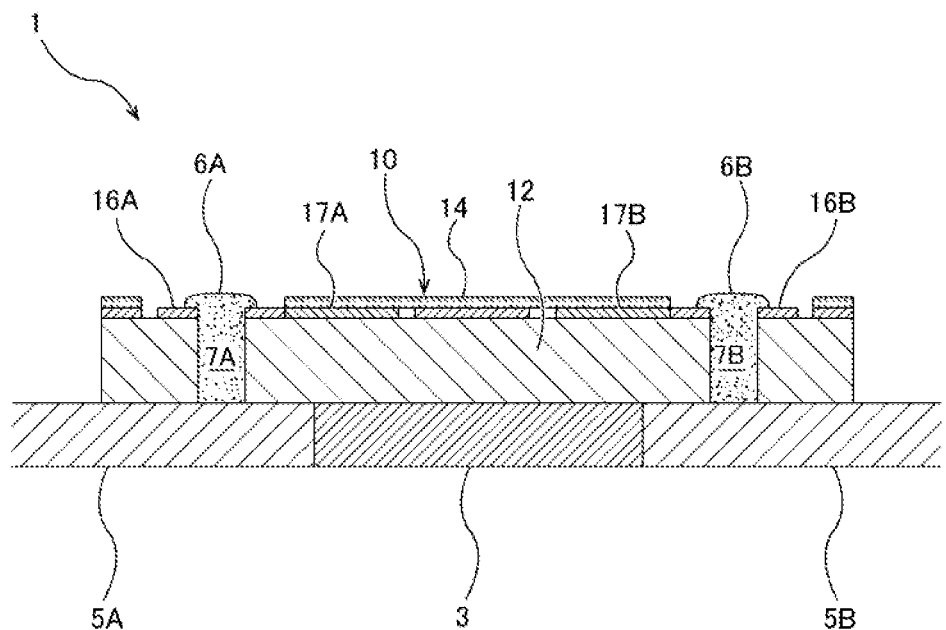
FIG. 9 is a cross-sectional view showing still another embodiment of a shunt resistor.

FIG. 9 is a cross-sectional view showing still another embodiment of a shunt resistor 1 configurations and manufacturing method of the present embodiment, which will not be particularly described, are the same as those of the embodiments described with reference to FIGS. 1 to 6, and repetitive descriptions thereof will be omitted.

In the present embodiment, inner walls forming the first through-hole 7A and the second through-hole 7B are composed of the base plate 12 itself. Specifically, the first through-hole 7A and the second through-hole 7B are holes formed in the base plate 12, and any conductive layer for covering inner walls of these holes is not provided. Open ends of the first through-hole 7A and the second through-hole 7B are surrounded by first land 16A and second land 16B, respectively, which are made of a conductive material, such as copper foil or gold foil.

The first fusion material 6A and the second fusion material 6B are filled in the entire first through-hole 7A and the entire second through-hole 7B. Ends of the first fusion material 6A and the second fusion material 6B are in contact with the first electrode 5A and the second electrode 5B, respectively, and the other ends of the first fusion material 6A and the second fusion material 6B are in contact with the first land 16A and the second land 16B, respectively. The first land 16A and the second land 16B are coupled to the first wire 17A and the second wire 17B, respectively. In the present embodiment, the first wire 17A and the second wire 17B are printed wires, but may be conductive wire cables. The first electrode 5A is electrically coupled to the first wire 17A through the first fusion material 6A and the first land 16A. The second electrode 5B is electrically coupled to the second wire 17B through the second fusion material 6B and the second land 16B. Positions of the first land 16A and the second land 16B may be on the front surface or the back surface of the base plate 12, and their positions are not particularly limited.

Figure 10:
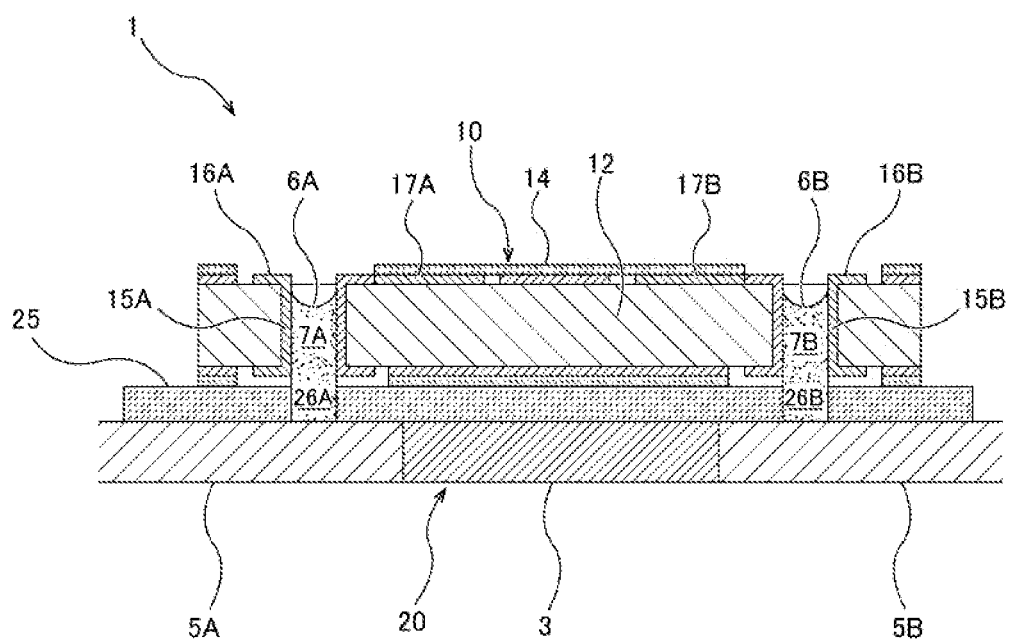
FIG. 10 is a cross-sectional view showing still another embodiment of a shunt resistor.

FIG. 10 is a cross-sectional view showing still another embodiment of the shunt resistor 1. Configurations and manufacturing method of the present embodiment, which will not be particularly described, are the same as those of the embodiments described with reference to FIGS. 1 to 6, and repetitive descriptions thereof will be omitted.

In this embodiment, the shunt resistor 1 includes an insulating plate 25 arranged between the board 10 and the first electrode 5A and second electrode 5B. The insulating plate 25 has through-holes 26A and 26B arranged in series with the first through-hole 7A and the second through-hole 7B, respectively. The first fusion material 6A is arranged in the first through-hole 7A and the through-hole 26A of the insulating plate 25. The second fusion material 6B is arranged in the second through-hole 7B and the through-hole 26B of the insulating plate 25. The insulating plate 25 can be provided with a mark, a tag, or the like that can be visually recognized by a user.

The shunt resistor 1 shown in FIG. 10 is basically the same as the embodiments described with reference to FIGS. 1 to 6. Specifically, the board 10 having the first through-hole 7A and the second through-hole 7B, the insulating plate 25 having the through-holes 26A and 26B, and the assembly 20 including the resistance element 3 and the first electrode 5A and the second electrode 5B coupled to both sides of the resistance element 3 are prepared.

Next, the unfused first fusion material 6A is disposed (filled) in the first through-hole 7A and the through-hole 26A of the insulating plate 25, and the unfused second fusion material 6B is disposed (filled) in the second through-hole 7B and the through-hole 26B of the insulating plate 25.

Then with the insulating plate 25 disposed between the board 10 and the assembly 20, the first fusion material 6A and the second fusion material 6B are heated, that the first fusion material 6A and the second fusion material 6B are fused. When the temperatures of the first fusion material 6A and the second fusion material 6B are lowered, the board 10 is coupled to the first electrode 5A and the second electrode 5B by the cured first fusion material 6A and the cured second fusion material 6B. The first fusion material 6A and the second fusion material 6B function as voltage-detection terminals.

Figure 11:
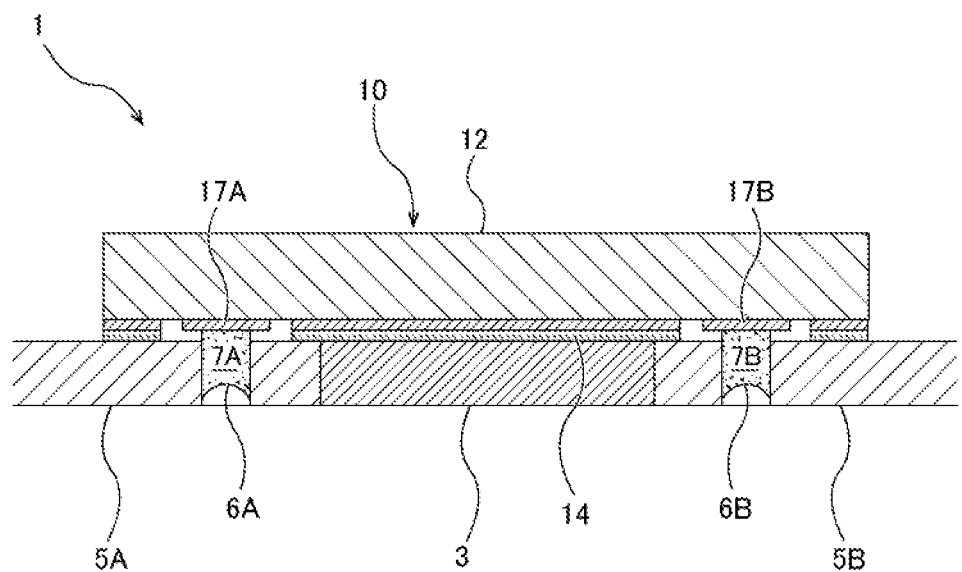
FIG. 11 is a cross sectional view showing still another embodiment of a shunt resistor.

FIG. 11 is a cross sectional view showing still another embodiment of a shunt resistor 1. Configurations and manufacturing method of the present embodiment, which not be particularly described, are the same as those of the embodiments described with reference to FIGS. 1 to 6, and repetitive descriptions the will be omitted.

In the present embodiment, first through-hole 7A and second through-hole 7B are formed in the first electrode 5A and the second electrode 5B, respectively. The board 10 does not have a through-hole. First wire 17A and second wire 17B of the board 10 face the first electrode 5A and the second electrode 5B, respectively. First fusion material 6A is arranged in the first through-hole 7A formed in the first electrode 5A, and second fusion material 6B is arranged in the second through-hole 7B formed the second electrode 5B. The first fusion material 6A is in contact with both the first electrode 5A and the first wire 17A, and the second fusion material 6B is in contact with both the second electrode 5B and the second wire 17B. The board 10 is coupled to the first electrode 5A and the second electrode by the first fusion material 6A and the second fusion material 6B. Also in this embodiment, the first fusion material 6A and the second fusion material 6B function as voltage-detection terminals.

Next, a method of manufacturing the shunt resistor 1 shown in FIG. 11 will be described with reference to FIGS. 12 to 15.

Figure 12:
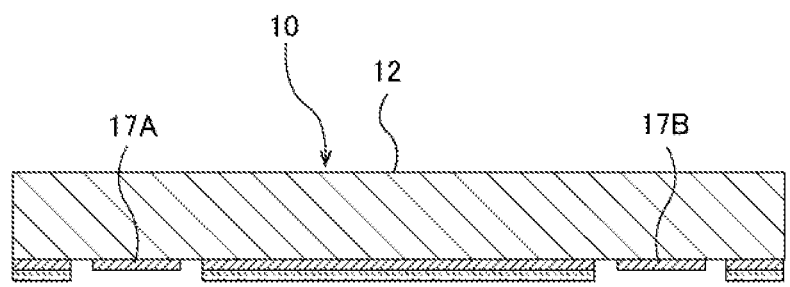
FIG. 12 illustrates an embodiment of a method of manufacturing the shunt resistor shown in FIG. 11.
Figure 12:
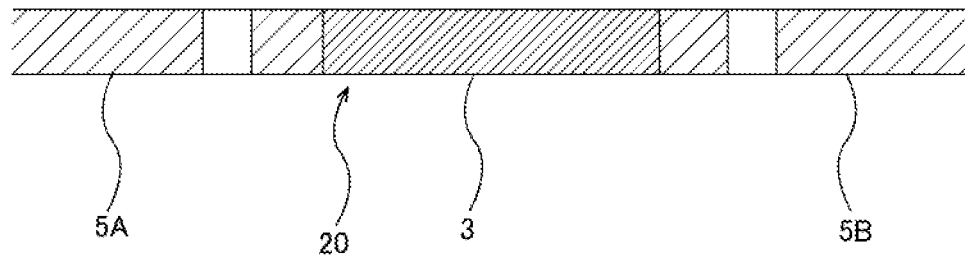

First, as shown in FIG. 12, the board 10 having the first wire 17A and the second wire 17B, and assembly 20 having the resistance element 3 and the first electrode 5A and the second electrode 5B coupled to both sides of the resistance element 3 are prepared. The first electrode 5A and the second electrode 5B have the first through-hole 7A and the second through-hole 7B, respectively.

Figure 13:
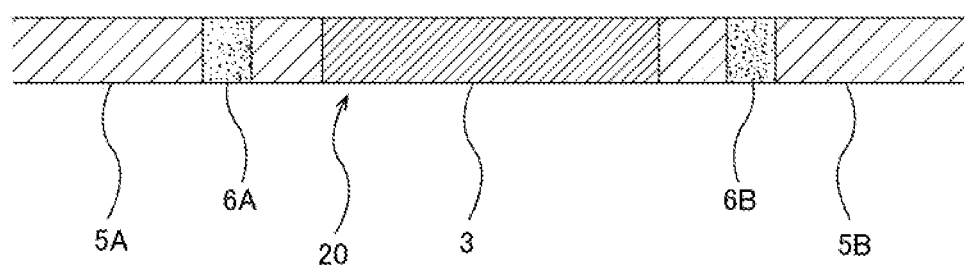
FIG. 13 illustrates an embodiment of the method of manufacturing the shunt resistor shown in FIG. 11.

Next, as shown in FIG. 13, the first fusion material 6A and the second fusion material 6B are disposed (filled) in the first through-hole 7A and the second through-hole 7B.

Figure 14:
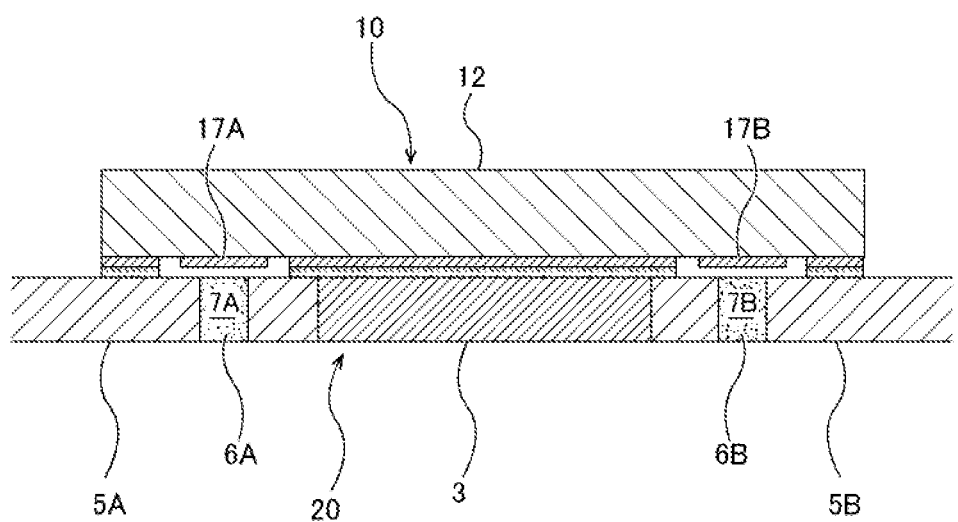
FIG. 14 illustrates an embodiment of the method of manufacturing the shunt resistor shown in FIG. 11.

As shown in FIG. 14, the board 10 is disposed such that the first wire 17A of the bard 10 faces the first through-hole 7A and the second wire 17B of the board 10 faces the second through-hole 7B.

In one embodiment after the board 10 is disposed on the assembly 20, the unfused first fusion material 6A and the unfused second fusion material 6B may be disposed (filled) in the first through-hole 7A and the second through-hole 7B, respectively.

Figure 15:
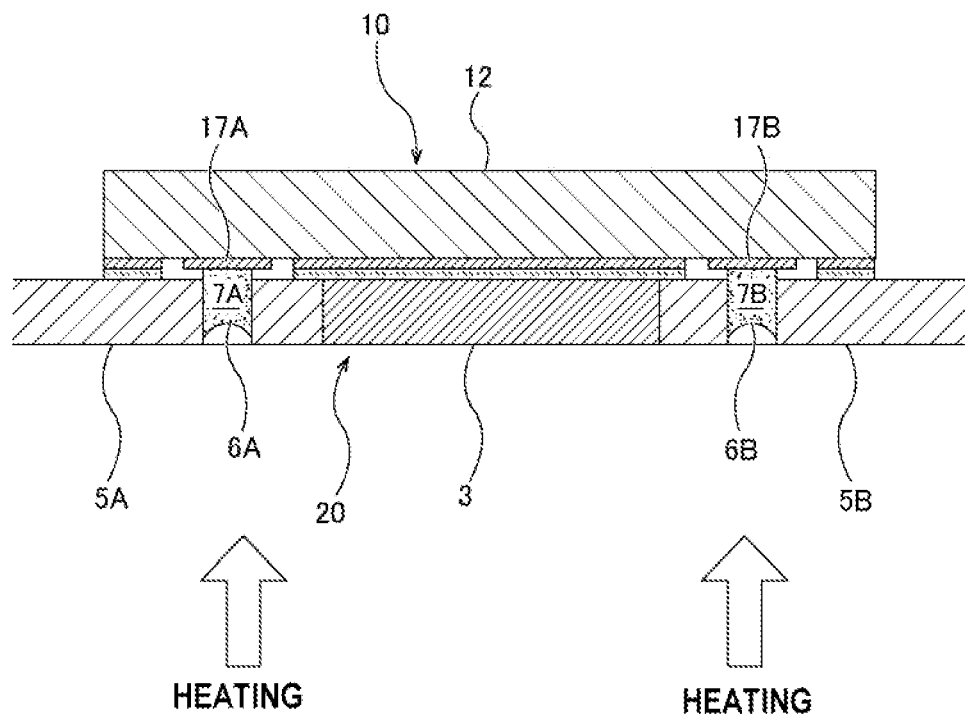
FIG. 15 illustrates an embodiment of the method of manufacturing the shunt resistor shown in FIG. 11.

As shown in FIG. 15, with the board 10 in contact with the assembly 20, the first fusion material 6A and the second fusion material 6B are heated, so that the first fusion material 6A and the second fusion material 6B are fused. The heating temperature is equal to or higher than a melting point of the first fusion material 6A and the second fusion material 6B. The heating of the first fusion material 6A and the second fusion material 6B may be heating the entireties of the hoard 10 and the assembly 20 including the first fusion material 6A and the second fusion material 6B, or may be locally heating the first fusion material 6A and the second fusion material 6B. For example, heating of the first fusion material 6A and the second fusion material 6B can be performed by using a reflow device, a laser heater, or the like.

When the fused first fusion material 6A and the fused second fusion material 6B are cooled, the first fusion material 6A and the second fusion material 6B are cured. The cured first fusion material 6A is joined to both the first electrode 5A and the first conductive layer 15A forming the inner wall of the first through-hole 7A. The cured second fusion material 6I3 is joined to both the second electrode 5B and the second conductive layer 15B forming the inner wall of the second through-hole 7B. The board 10 is coupled to the first electrode 5A and the second electrode 5B by the first fusion material 6A and the second fusion material 6B. Since the first fusion material 6A and the second fusion material 6B are in contact with the first electrode 5A and the second electrode 5B, respectively, the first fusion material 6A and the second fusion material 6B function as voltage-detection terminals of the shunt resistor 1.

The shunt resistor 1 of each of the above-described embodiments can be applied to current measurement, such as four-terminal measurement. Using the shunt resistor 1 according to the above embodiments enables highly accurate current detection.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention relates to a shunt resistor for current detection, and is particularly applicable to a voltage-detection terminal of the shunt resistor. The present invention is also applicable to a method of manufacturing such a shunt resistor.

REFERENCE SIGNS LIST 1 shunt resistor
3 resistance element
5A first electrode
5B second electrode
6A first fusion material
6B second fusion material
7A first through-hole
7B second through-hole
9A,9B bolt hole
10,11 board
12 base plate
14 insulating layer
15A first conductive layer
15B second conductive layer
16A first land
16B second land
17A first wire
17B second wire
20 assembly
22A third through-hole
22B fourth through-hole
23A,23B wire
25 insulating plate
26A,26B through-hole

The invention claimed is:

1. A shunt resistor comprising:
a resistance element;
a first electrode and a second electrode coupled to both sides of the resistance element;
a first fusion material and a second fusion material electrically coupled to the first electrode and the second electrode, respectively, the first fusion material and the second fusion material having electric conductivity; and
at least one board coupled to the first electrode and the second electrode by the first fusion material and the second fusion material, wherein the first fusion material is arranged in a first through-hole formed in the first electrode or the board, and the second fusion material is arranged in a second through-hole formed in the second electrode or the board.

2. The shunt resistor according to claim 1, wherein the first through-hole and the second through-hole are formed in the board.

3. The shunt resistor according to claim 1, wherein the board further includes conductive layers constituting an inner wall of the first through-hole and an inner wall of the second through-hole.

4. The shunt resistor according to claim 1, wherein the first fusion material and the second fusion material comprise solder.

5. The shunt resistor according to claim 1, wherein the board is a wiring board having a first wire and a second wire electrically coupled to the first fusion material and the second fusion material, respectively.

6. The shunt resistor according to claim 1, further comprising an insulating plate arranged between the board and the first and second electrodes.

7. A method of manufacturing a shunt resistor, comprising:

preparing at least one board having a first through-hole and a second through-hole;

disposing a first fusion material and a second fusion material in the first through-hole and the second through-hole, respectively, the first fusion material and the second fusion material having electric conductivity;

heating the first fusion material and the second fusion material, with the first through-hole and the second through-hole facing a first electrode and a second electrode, respectively, until the first fusion material and the second fusion material are fused, the first electrode and the second electrode being coupled to both sides of a resistance element; and coupling the board to the first electrode and the second electrode by the first fusion material and the second fusion material.

8. The method of manufacturing the shunt resistor according to claim 7, wherein the first fusion material and the second fusion material comprise solder.

9. A method of manufacturing a shunt resistor, comprising:

preparing a first electrode and a second electrode coupled to both sides of a resistance element;

disposing a first fusion material and a second fusion material in a first through-hole and a second through-hole, respectively, the first through-hole and the second through-hole being formed in the first electrode and the second electrode, respectively, the first fusion material and the second fusion material having electric conductivity;

heating the first fusion material and the second fusion material, with a board facing the first through-hole and the second through-hole, until the first fusion material and the second fusion material are fused; and coupling the board to the first electrode and the second electrode by the first fusion material and the second fusion material.

10. The method of manufacturing the shunt resistor according to claim 9, wherein the first fusion material and the second fusion material comprise solder.

* * * * *